United States Patent
Thierry et al.

(10) Patent No.: US 7,667,524 B2
(45) Date of Patent: Feb. 23, 2010

(54) DRIVER CIRCUIT AND METHOD WITH REDUCED DI/DT AND HAVING DELAY COMPENSATION

(75) Inventors: Vincent Thierry, La Roque d'Antheron (FR); Bruno Nadd, Lourmarin (FR); Andre Mourrier, Sainte Tulle (FR)

(73) Assignee: International Rectifier Corporation, El Segundo, CA (US)

( * ) Notice: Subject to any disclaimer, the term of this patent is extended or adjusted under 35 U.S.C. 154(b) by 662 days.

(21) Appl. No.: 11/264,970

(22) Filed: Nov. 2, 2005

(65) Prior Publication Data

US 2006/0120004 A1 Jun. 8, 2006

Related U.S. Application Data

(60) Provisional application No. 60/625,214, filed on Nov. 5, 2004.

(51) Int. Cl.
*H03K 17/04* (2006.01)
(52) U.S. Cl. .................................. 327/374; 327/427
(58) Field of Classification Search .................. 327/374, 327/376–377, 380–383, 427, 432, 434
See application file for complete search history.

(56) References Cited

U.S. PATENT DOCUMENTS

| | | | |
|---|---|---|---|
| 5,543,739 A * | 8/1996 | Bontempo et al. .......... 327/108 |
| 5,656,969 A * | 8/1997 | Pulvirenti et al. .......... 327/561 |
| 6,271,709 B1 * | 8/2001 | Kimura et al. .............. 327/380 |
| 6,333,665 B1 * | 12/2001 | Ichikawa .................... 327/434 |
| 6,407,594 B1 * | 6/2002 | Milazzo et al. ............. 327/112 |
| 2004/0145406 A1 * | 7/2004 | Tai ............................. 327/432 |

* cited by examiner

*Primary Examiner*—Quan Tra
(74) *Attorney, Agent, or Firm*—Farjami & Farjami LLP

(57) ABSTRACT

A method of driving a power transistor switch comprising: receiving a drive input signal; converting the drive input signal into a converted drive input signal; and providing the converted gate drive input signal to a control electrode of the switch to turn on the switch, the converted drive input signal having three regions with respect to time, each having a slope, a first region in time having a first slope up to a Miller Plateau of the switch; a second region in time having a second slope with a reduced slope compared with the first slope; and a third region having a third slope that is greater than the second slope, whereby the control electrode voltage rapidly reaches the Miller Plateau voltage, then more slowly reaches a threshold voltage of the switch and then, when the switch has substantially fully turned on, the control electrode voltage is rapidly increased. The switch delay time is also maintained substantially constant by adjusting the transistor control electrode precharge voltage.

16 Claims, 10 Drawing Sheets

US 7,667,524 B2

DRIVER CIRCUIT AND METHOD WITH REDUCED DI/DT AND HAVING DELAY COMPENSATION

CROSS REFERENCE TO RELATED APPLICATIONS

This application claims the benefit and priority of U.S. Provisional Patent Application No. 60/625,214 filed Nov. 5, 2004, entitled DRIVER CIRCUIT WITH REDUCED DI/DT AND HAVING DELAY COMPENSATION, the entire disclosure of which is incorporated by reference herein.

BACKGROUND OF THE INVENTION

The present invention relates to driver circuits, and in particular, to a driver circuit which reduces the rate of change of current during switching (dI/dt) and therefore reduces EMI (electromagnetic interference). At the same time, it is an aim of the present invention to have a large dv/dt, that is, a large rate of change of voltage to reduce dissipation and switching losses. It is further an object of the invention to provide a driver circuit with delay compensation by adjusting the gate precharge voltage.

SUMMARY OF THE INVENTION

According to the present invention, a driver circuit which implements a three slope gate drive for a power switch, for example, a power MOSFET, is provided. In particular, the invention comprises a method of driving a power transistor switch comprising receiving a drive input signal; converting the drive input signal into a converted gate drive input signal; and providing the converted drive input signal to a control electrode of the switch to turn on the switch, the converted drive input signal having three regions with respect to time, each having a slope, a first region in time having a first slope up to a Miller Plateau of the switch; a second region in time having a second slope comprising a reduced slope compared with the first slope; and a third region having a third slope that is greater than the second slope, whereby the control electrode voltage rapidly reaches the Miller Plateau voltage, then more slowly reaches a threshold voltage of the switch and then, when the switch has substantially fully turned on, the control electrode voltage is rapidly increased.

According to a further aspect, the precharge voltage of the switch is adjusted automatically to control the delay time when turning on the switch so that the delay time can be maintained substantially constant.

BRIEF DESCRIPTION OF THE DRAWINGS

The invention will now be described in greater detail in the following detailed description with reference to the drawings in which:

FIG. 9 comprising

FIG. 11 comprising

DETAILED DESCRIPTION

Figure 1:
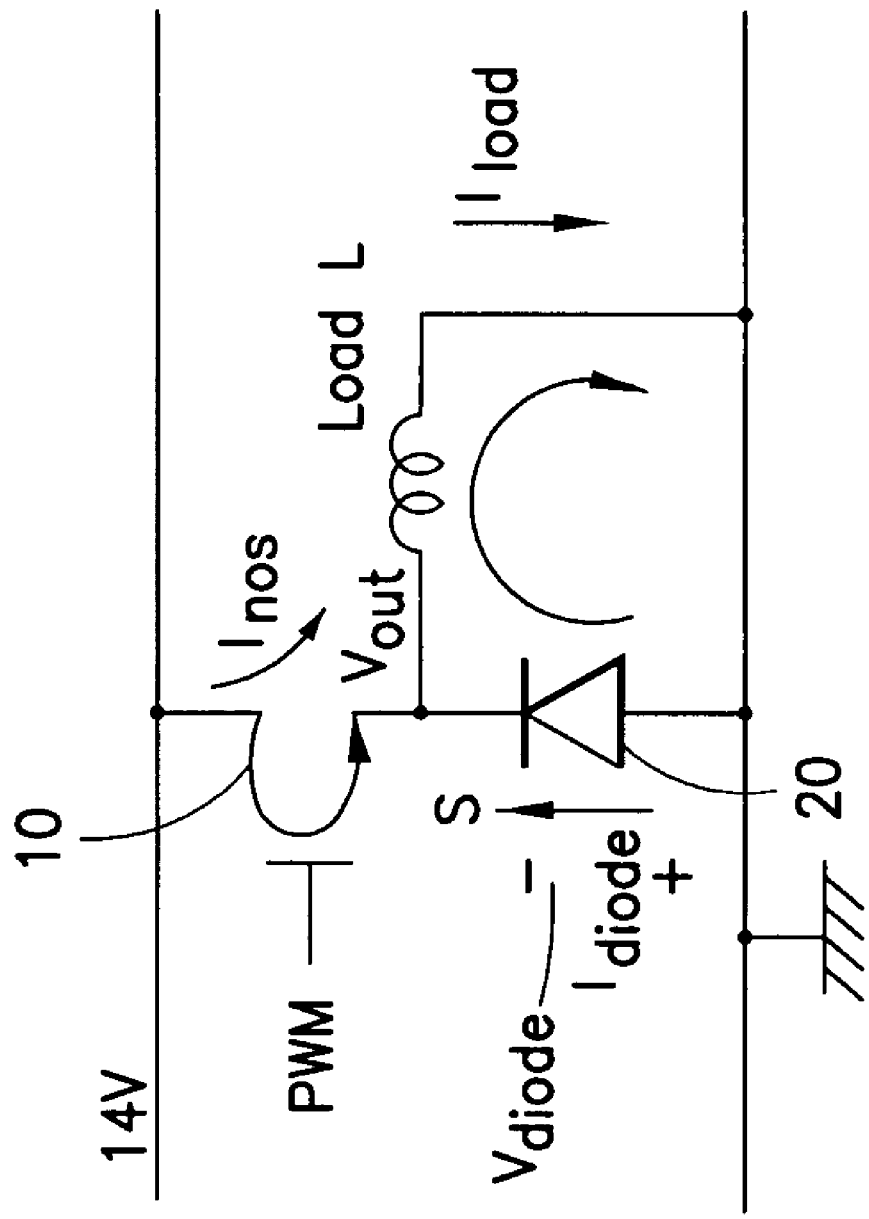
FIG. 1 shows a power switching circuit driving a load.
Figure 2:
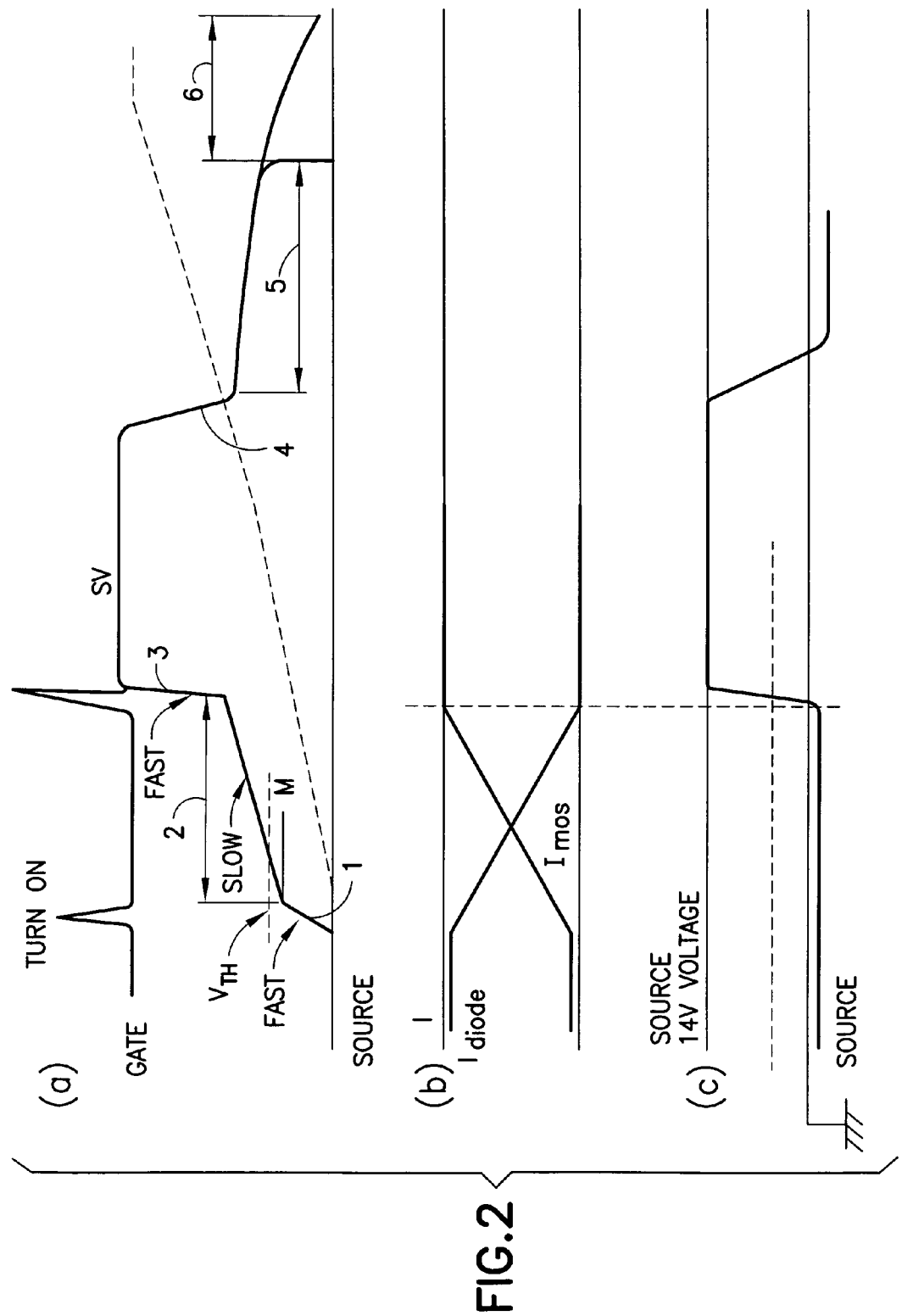
FIGS. 2A, 2B and 2C show waveforms in connection with the circuit of FIG. 1.

According to the present invention, a driver circuit which implements a three slope gate drive for a power switch, e.g., a power MOSFET, is provided. FIG. 1 shows a power switching circuit driving a load, indicated as an inductive load L. The switching circuit can be a converter output circuit or a motor drive, for example. According to the invention, the power switch 10 is turned on by a gate signal having three distinct regions. During initial gate drive of the power switching transistor 10 shown in FIG. 1, the gate of the switching transistor 10, as shown in FIG. 2, is provided with a gate voltage (region 1) which rapidly rises until the Miller Plateau M is reached. See FIG. 2A. This is necessary to prevent excessive delay. Once the Miller plateau M is reached, which is generally below the threshold voltage Vth (FIG. 2A) of the switching transistor, a second, slower rate of change gate voltage is applied in region 2 to reduce dI/dt and EMI. Finally, when the free wheeling diode 20, as shown in FIG. 1, stops conducting, the gate voltage is rapidly increased with a high rate of voltage change in region 3. This is shown in FIG. 2A. The gate voltage then reaches its maximum gate voltage, for example, typically five volts. Although a diode 20, is shown, the diode may be a synchronous transistor switch.

The three slope gate drive according to the invention has the effect of reducing the dI/dt and therefore EMI emissions while at the same time improving the dv/dt to lower switching losses and power dissipation.

During turn off of the power switch, as shown at the right hand portion of FIG. 2A, the operation is reversed. That is, a rapid rate of change of voltage in the decreasing direction (region 4) is first implemented, followed by a more gradual rate of change (region 5) until the Miller Plateau is reached followed by a more rapid rate of change (region 6).

FIG. 2B shows the current in the diode 20 (I diode) as well as the current in the switch 10 (I MOS). FIG. 2C shows the source voltage Vout with respect to ground showing that when the diode 20 is conducting, the voltage is approximately −0.6 volts. When the diode stops conducting when the switch 10 is fully turned on, the gate drive is in the third region 3. When the gate voltage increases rapidly, the diode stops conducting and the voltage at the source or across the diode reaches the VCC level, shown illustratively at 14 volts. In the right hand portion of FIG. 2C, the waveform across the diode or the source voltage is shown during turn off.

Figure 3:
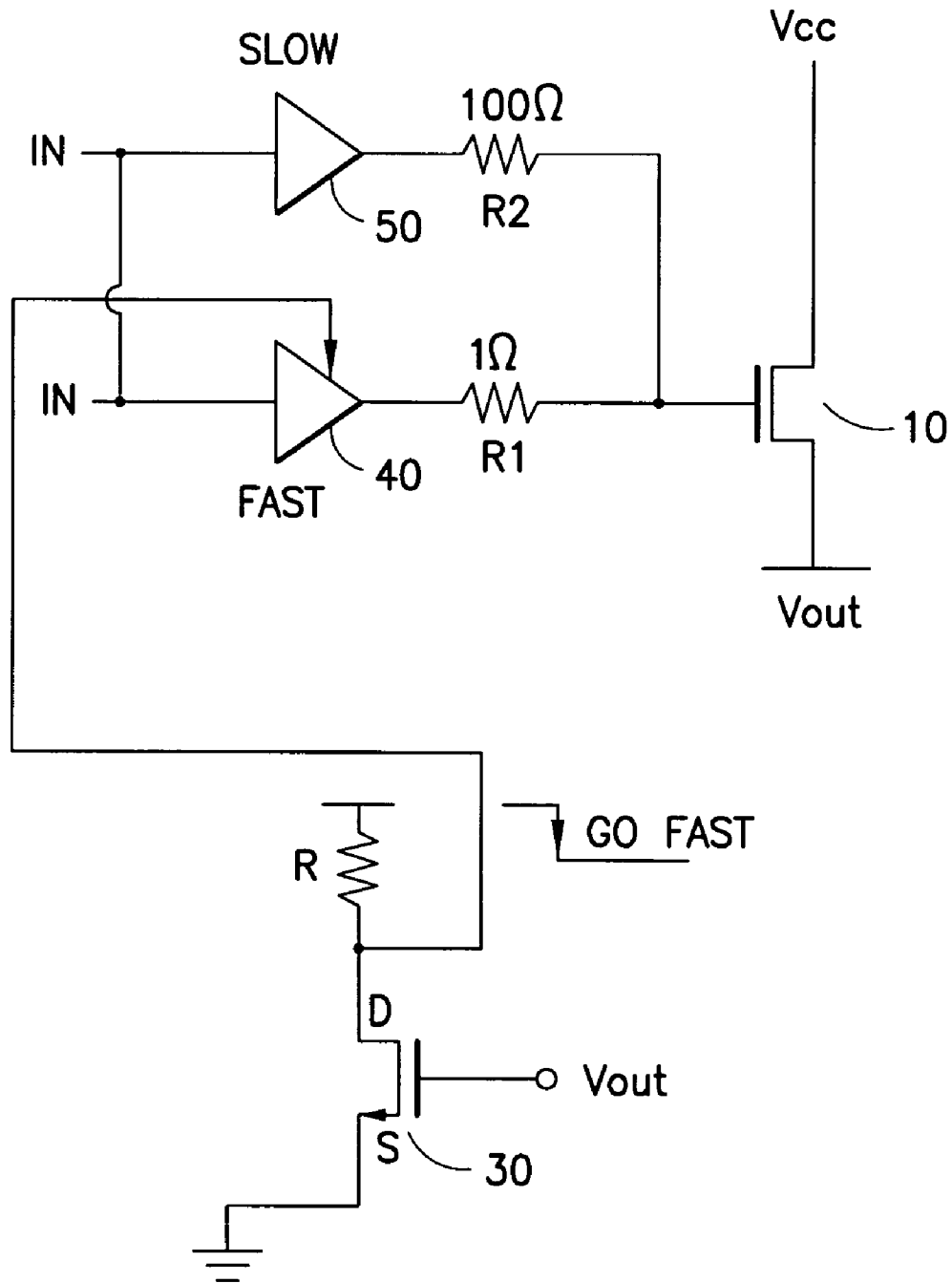
FIG. 3 shows one implementation of the three slope gate driver circuit.

FIG. 3 shows one implementation of the three slope gate driver circuit. The output voltage Vout across the load is fed to the gate of a transistor 30.

In the initial region 1, before the Miller Plateau is reached, the switching transistor 10 is driven on sharply to achieve a high dv/dt. This can be done by driving the transistor 10 with the expected Vgs gate voltage.

When the source voltage is −0.6 volts, the diode is conducting. When the diode 20 is conducting, the output transistor 10 is not turned on. Therefore switch 30 is off, and a high logic signal is provided to operational amplifier 40, keeping it turned off and accordingly, the switch 10 is not driven on sharply. During this time an operational amplifier 50 is controlled on and drives the gate of transistor 10 through resistor R2 This provides the slower, lower slope gate drive in the region 2 after the Miller Plateau is reached and during the time when the diode 20 is still conducting.

When the diode stops conducting and the switch 10 starts fully conducting and driving the load, the output voltage increases as shown in FIG. 2C. This will turn switch 30 fully on, dropping a voltage across resistor R and bringing the drain of transistor 30 to approximately ground. This will control the operational amplifier 40, causing the output to drive the transistor 10 sharply on, thereby implementing the third slope region 3 in the gate voltage.

Figure 4:
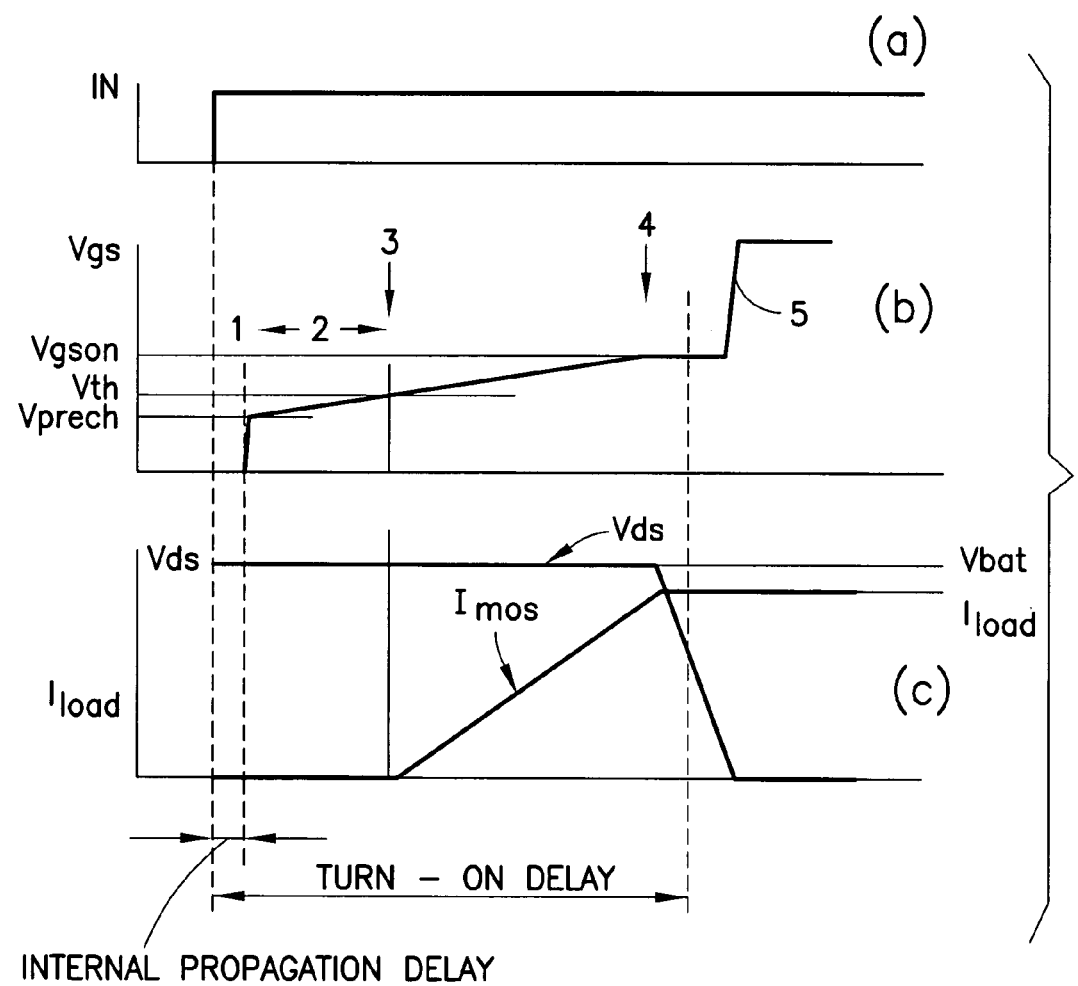
FIG. 4 shows the basic waveforms of the three slope gate driver circuit.

In a further embodiment of the invention, a closed loop control circuit is used to self-adjust the gate pre-charge voltage to compensate for turn-on delay. FIG. 4 shows the basic waveforms described previously. In the initial region 1 the gate is charged quickly to V Prech, the precharge voltage on the gate. In the region 2 the gate is charged at constant current. At 3, Vgs reaches Vth, the MOSFET threshold voltage. From 3 to 4, the gate is still charged up at constant current so the current IMOS through the switch 10 increases. See FIG. 4C. At stage 4, IMOS reaches the load current value I load. Vds begins to decrease which is detected and the gate current is increased to a high value at 5 by rapidly increasing Vgs.

Figure 5:
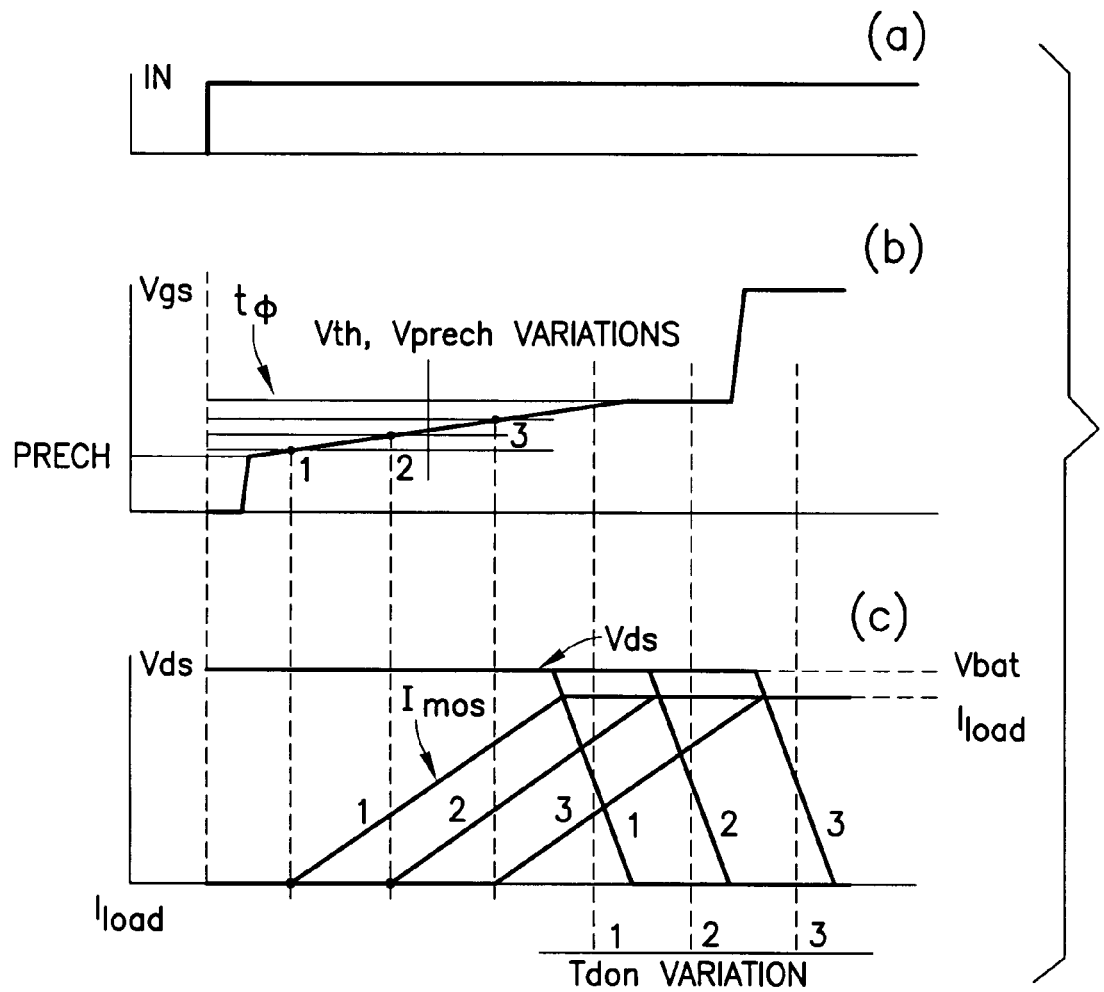
FIG. 5 shows the effect of changing the threshold voltage with a constant current load and constant voltage supply.

FIG. 5 shows the effect of changing Vth keeping I load and VCC constant. The gate is quickly charged to Vprech in time to. Vprech is a fixed voltage. The problem is that if the threshold voltage Vth of the switch 10 is variable due to process variations or temperature variations, the point where the switch turns on and where IMOS will start to rise will move from waveform 1 to 2 to 3 as shown in FIG. 5, depending on Vth. This results in very large Tdon (turn on delay time) variations, as shown, because the gate is charging at constant current. If Vth is higher, then if Vprech is fixed, it will take longer to reach Vth, resulting in longer delay times.

Figure 6:
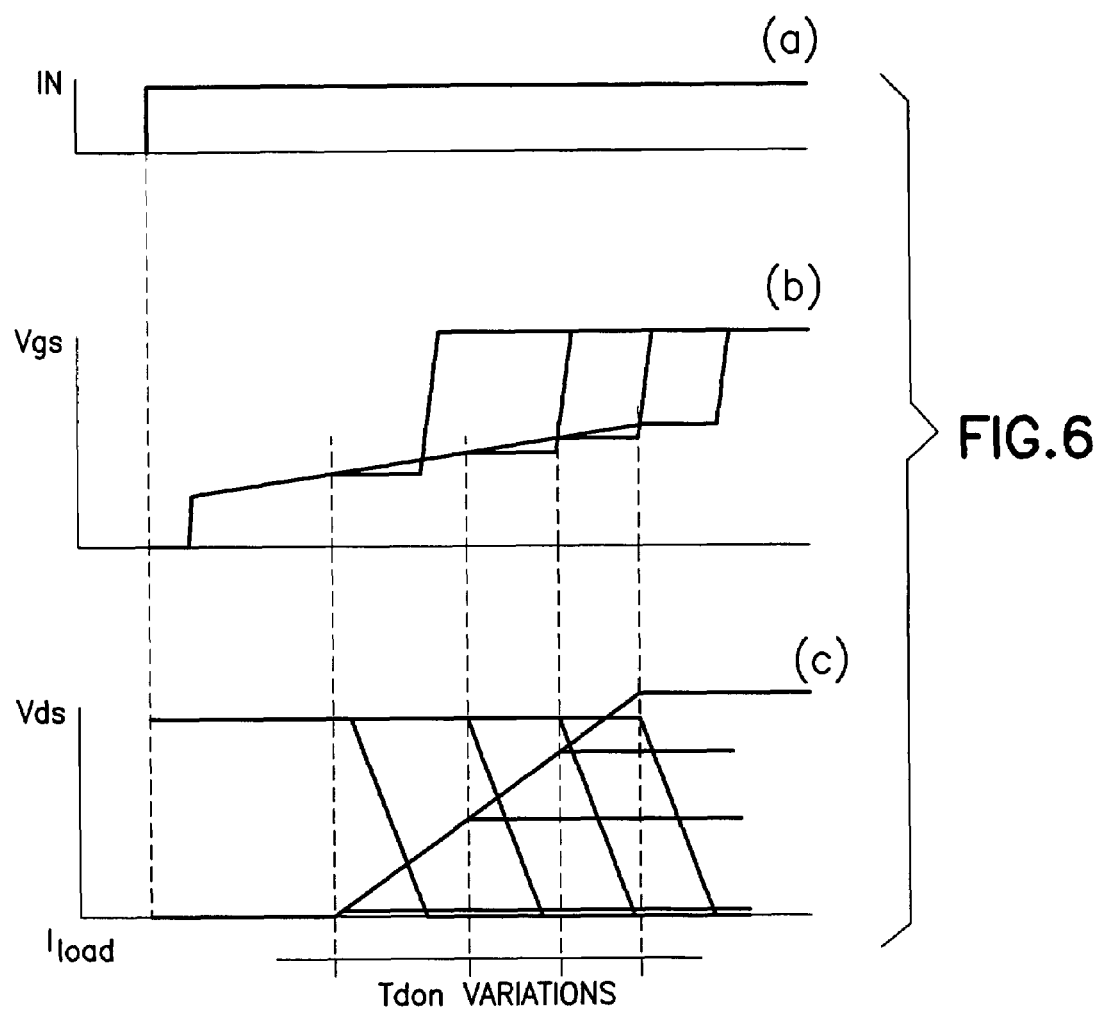
FIG. 6 shows the effect on delay time of load current variation.

FIG. 6 shows similarly that if the load current varies, the delay time will also vary considerably.

Figure 7:
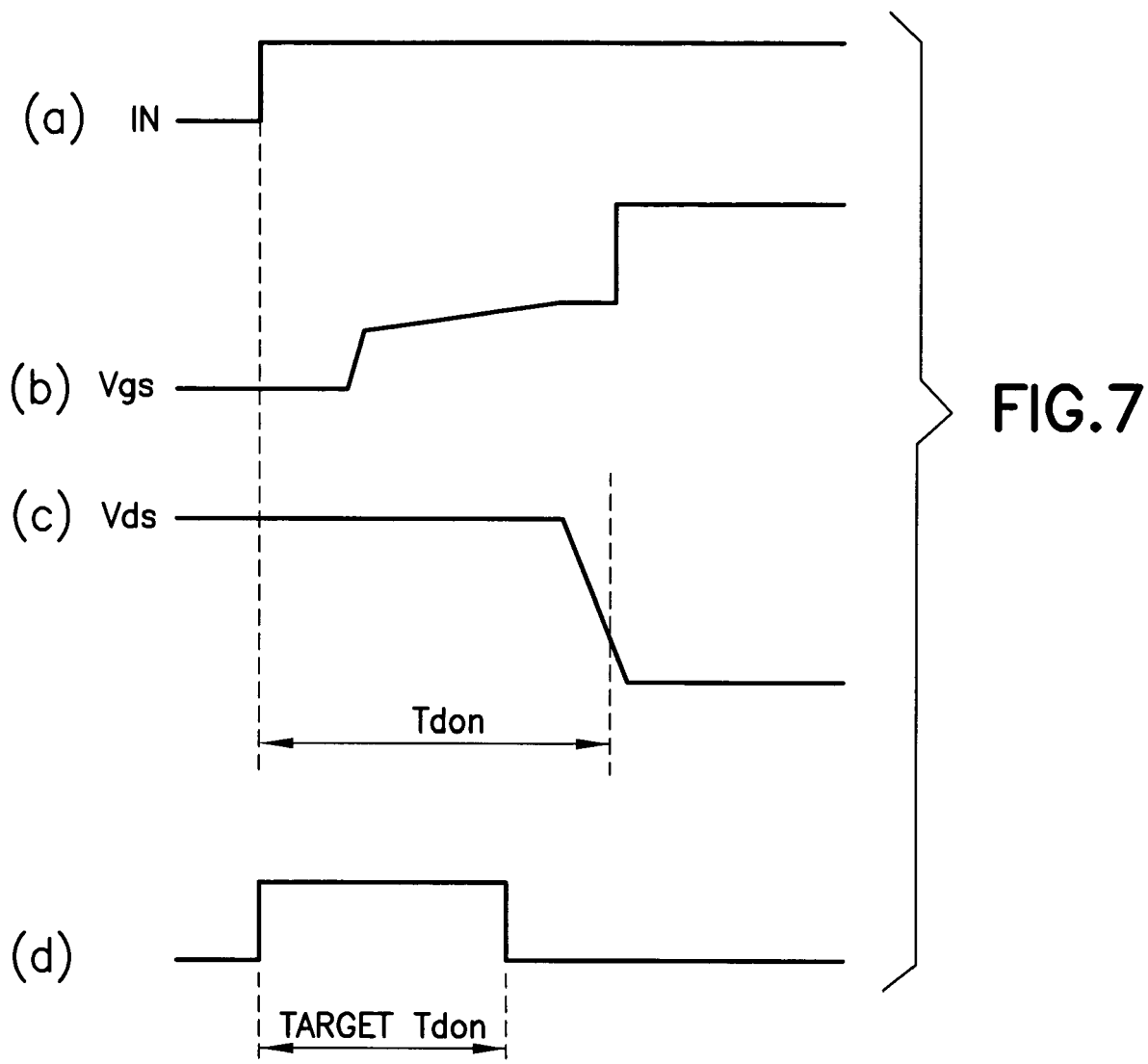
FIG. 7 shows waveforms implemented by an embodiment of the invention wherein the delay time is controlled through a closed loop control.

FIG. 7 shows waveforms implemented by an embodiment of the invention wherein the delay time is controlled through a closed loop control of Vprech.

In this implementation, an input control voltage IN is provided to the driver circuit. The output of the driver circuit is Vgs, the three slope drive as described previously (FIG. 7(b)). The voltage across the switch 10 drain to source is shown (Vds) in FIG. 7(c) as well as the time delay Tdon (FIG. 7(d)). It is desired to have a target tdon as shown in FIG. 7(d).

Figure 8:
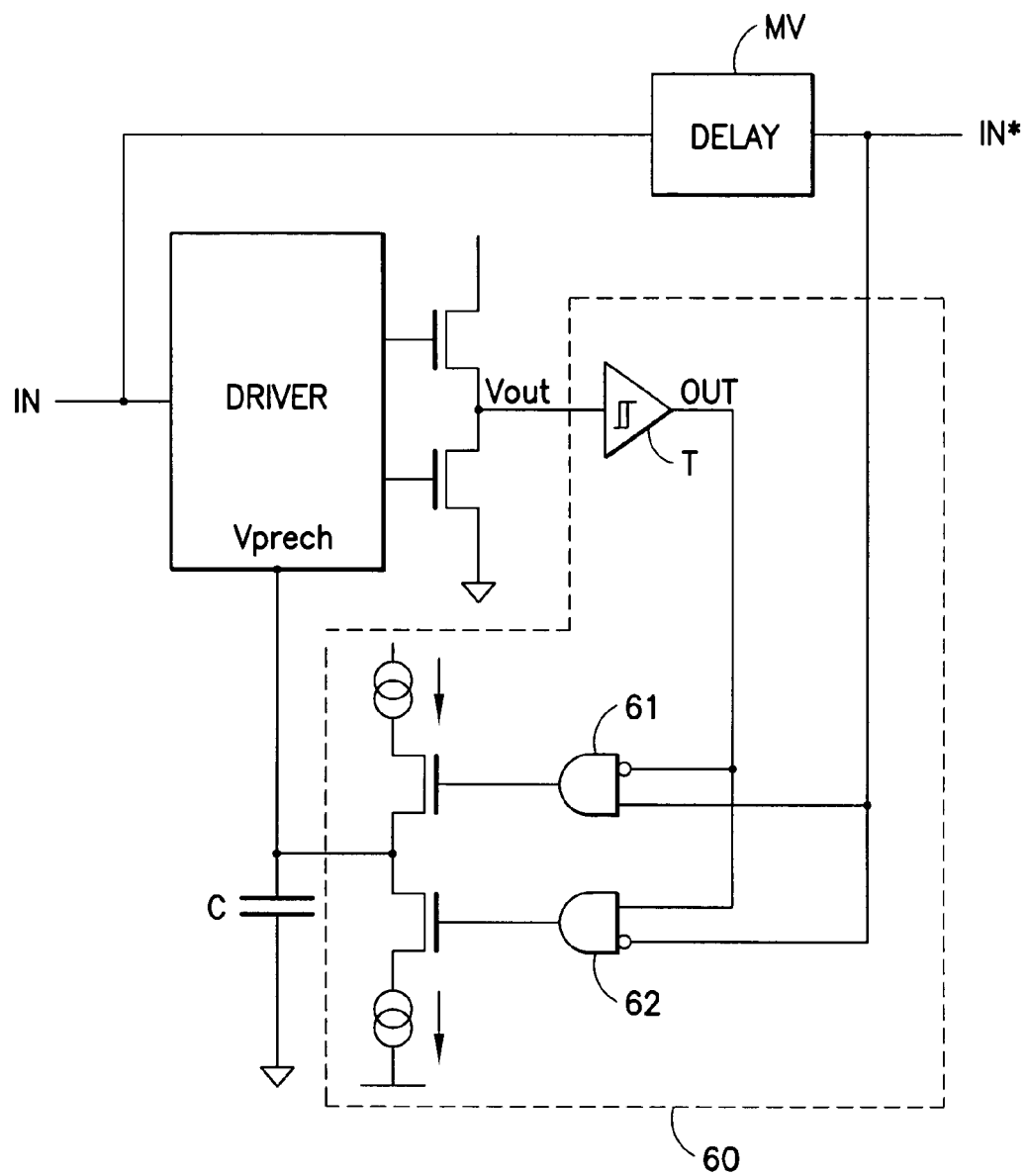
FIG. 8 shows a circuit implementation for controlling delay time according to the invention.

FIG. 8 shows a circuit implementation for achieving the target delay time. In this implementation, a logic circuit 60 is used to monitor the output voltage. The block 50 is the driver circuit implementing the three slope drive, described above. In order to implement this control, a monostable multivibrator Mv (FIG. 8), for example, is triggered on the rising edge of the input voltage IN. This is shown in FIG. 7(d). A logic signal image OUT of Vout is generated by trigger device T (FIG. 8) and is compared to the monostable output in gates 61 and 62. If the turn-on of Vout is longer, Vprech is increased and if it is shorter, Vprech is decreased. The system will thus self-adjust the precharge voltage Vprech to provide a fixed tdon no matter the process and other parameter variations of the switch.

Figure 9A:
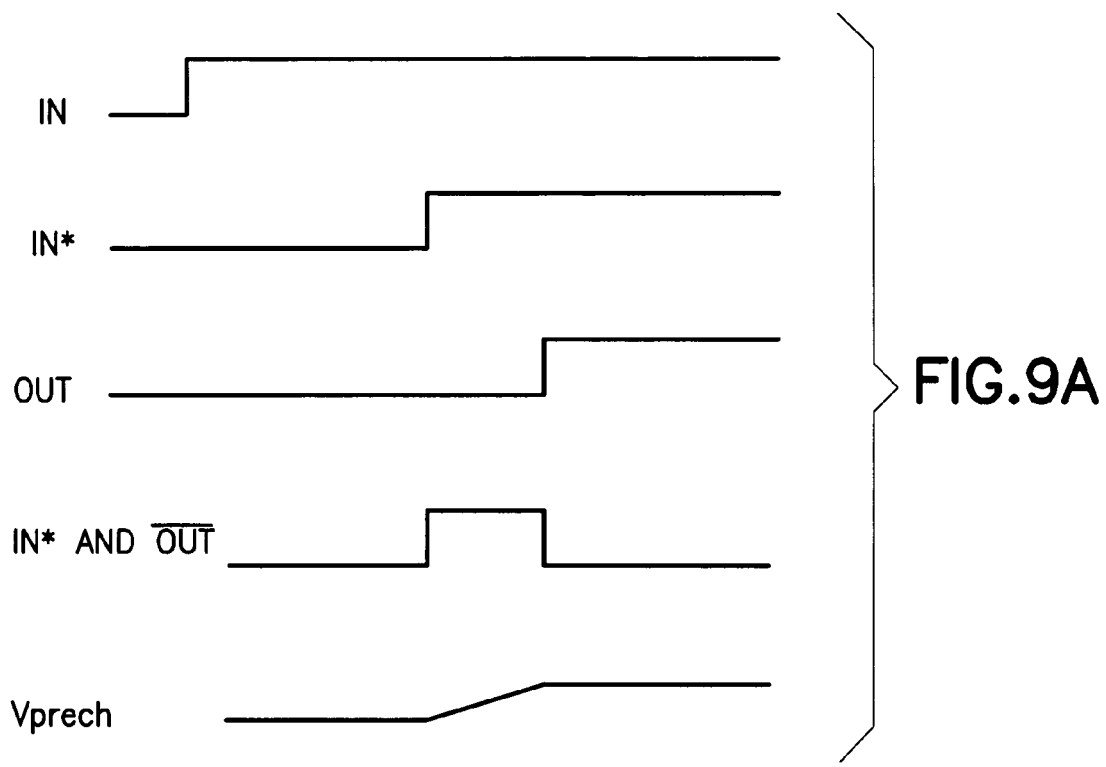
FIGS. 9A and 9B show waveforms in the circuit of FIG. 8.

As shown in FIG. 9, if the delay time is too long, the logic circuit 60 will produce from the delayed input signal IN* and the inverse of the output signal OUT the signal IN*AND OUTNOT via logic gate 61. This will cause the voltage Vprech across a capacitor C to increase as shown in FIG. 9A thereby reducing the delay time because the threshold voltage Vth is reached more quickly from the higher precharge voltage.

Figure 9B:
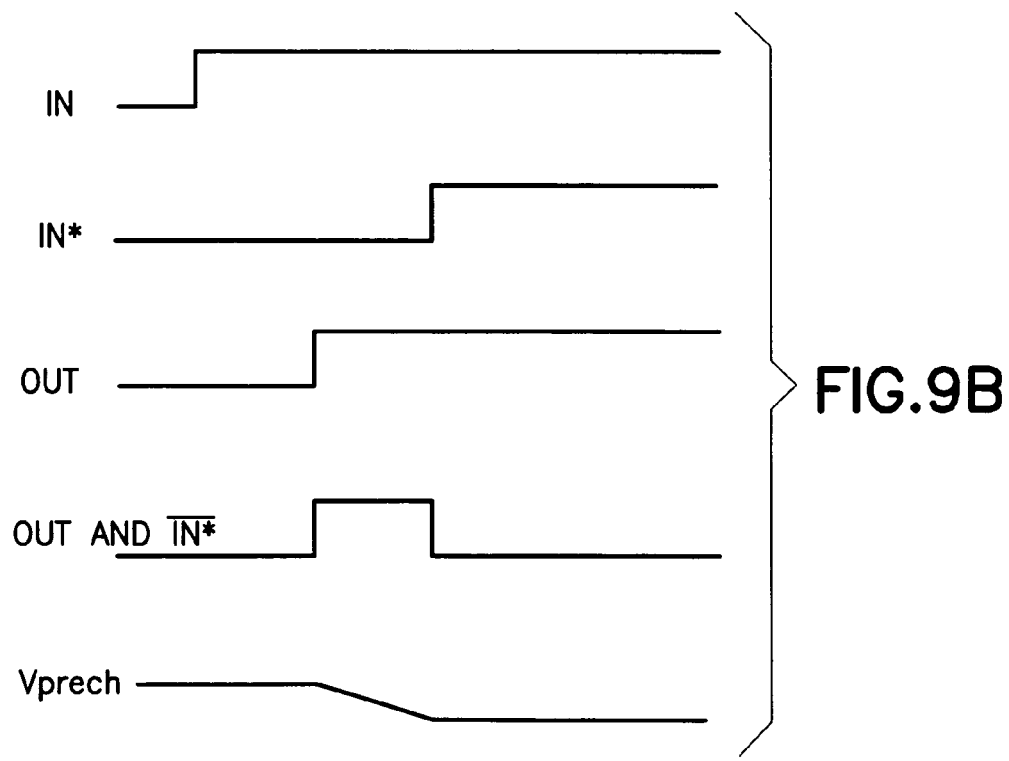

In contrast, as shown in FIG. 9B, should the delay time be too short, Vprech is decreased. In this case, the output of the logic circuit which comprises the logical combination of OUTAND IN*NOT (via gate 62) causes Vprech to decrease, thereby increasing the delay time to the desired amount.

Figure 10:
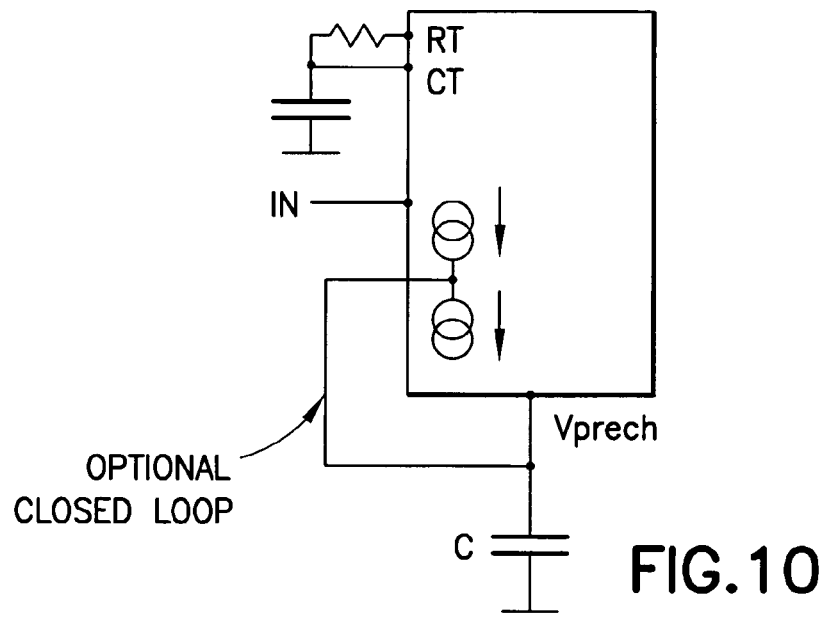
FIG. 10 shows an implementation of the circuit of FIG. 8 in a single driver integrated circuit.

FIG. 10 shows an implementation of the circuit of FIG. 8 in a single driver integrated circuit. The closed loop charges and discharges the capacitor C in the same way as in FIG. 8.

Figure 11A:
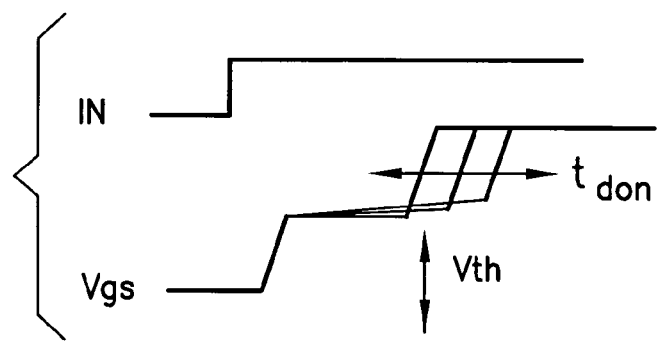
FIGS. 11A and 11B shows the variation of delay time with threshold voltage.
Figure 11B:
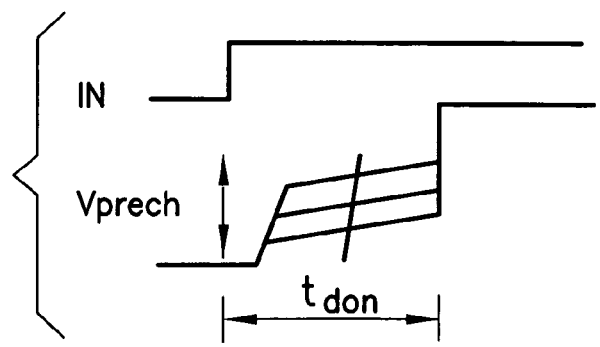

FIG. 11A shows that the delay tdon varies normally with Vth. By using this circuit according to the invention, and adjusting Vprech, tdon may be kept constant, as shown in FIG. 11B.

The circuit of the present invention thus reduces the dI/dt to reduce the EMI yet has a sufficient dv/dt to minimize switching losses. The circuit also compensates the turn on delay for threshold voltage variation by adjusting the gate precharge voltage.

Although the present invention has been described in relation to particular embodiments thereof, many variations and modifications and other uses will become apparent to those skilled in the art. Therefore, the present invention should be limited not by the specific disclosure herein, but only by the appended claims.

What is claimed is:

1. A method of driving a power transistor switch comprising:

receiving a drive input signal;

converting the drive input signal into a converted drive input signal; and providing the converted gate drive input signal to a control electrode of the switch to turn on the switch, the converted drive input signal having three regions with respect to time, each having a slope, a first region in time having a first slope up to a Miller Plateau of the switch; a second region in time having a second slope with a reduced and positive slope compared with the first slope; and a third region having a third slope that is greater than the second slope, whereby the control electrode voltage rapidly reaches the Miller Plateau voltage, then more slowly reaches a threshold voltage of the switch and then, when the switch has substantially fully turned on, the control electrode voltage is rapidly increased.

2. The method of claim 1 further comprising adjusting a precharge voltage on the control electrode of the switch to maintain a desired delay time between a start of the drive input signal and a time when the switch is substantially fully on.

3. The method of claim 1 further comprising providing a first driver circuit providing a control electrode drive signal having a slope; providing a second driver circuit providing a control electrode drive signal having an increased slope;

driving the switch in the first region with the drive input signal;

detecting an output voltage from the switch; and when the output voltage is at a first level, driving the switch with the first driver circuit; and when the output voltage is at a second level, driving the switch with the second driver circuit.

4. The method of claim 2, further comprising:

receiving the drive input signal;

comparing the start of the drive input signal to an output signal from the switch and determining the amount of time delay between the start of the drive input signal and said output signal; and adjusting the precharge voltage on the switch such that the precharge voltage is increased if the delay time is greater than the desired delay time and reduced if the delay time is less than the desired delay time.

5. The method of claim 1, further comprising, when it is desired to turn off said switch, providing said converted drive input signal such that, in time sequence, a turn off signal is provided that has a fourth slope, a fifth slope which is reduced with respect to said fourth slope and a sixth slope which is increased with respect to said fifth slope.

6. The method of claim 1, wherein said converted drive input signal reduces EMI.

7. The method of claim 1, wherein said converted drive input signal reduces switching losses.

8. The method of claim 2, wherein said switch is a MOSFET and said step of adjusting the precharge voltage comprises adjusting the voltage on a gate capacitance of said switch.

9. A circuit for driving a power transistor switch comprising:

a circuit receiving a drive input signal;

the circuit converting the drive input signal into a converted drive input signal; and wherein the converted gate drive input signal is provided to a control electrode of the switch to turn on the switch, the converted drive input signal having three regions with respect to time, each having a slope, a first region in time having a first slope up to a Miller Plateau of the switch;

a second region in time having a second slope with a reduced and positive slope compared with the first slope; and a third region having a third slope that is greater than the second slope, whereby the control electrode voltage rapidly reaches the Miller Plateau voltage, then more slowly reaches a threshold voltage of the switch and then, when the switch has substantially fully turned on, the control electrode voltage is rapidly increased.

10. The circuit of claim 9, further comprising a circuit for adjusting a precharge voltage on the control electrode of the switch to maintain a desired delay time between a start of the drive input signal and a time when the switch is substantially fully on.

11. The circuit of claim 9, further comprising a first driver circuit providing a control electrode drive signal having a slope; a second driver circuit providing a control electrode drive signal having an increased slope;

the switch being driven in the first region with the drive input signal; and a detector detecting an output voltage from the switch; and when the output voltage is at a first level, driving the switch with the first driver circuit; and when the output voltage is at a second level, driving the switch with the second driver circuit.

12. The circuit of claim 10, further comprising:

a circuit for comparing the start of the drive input signal to an output signal from the switch and determining the amount of time delay between the start of the drive input signal and said output signal; and a circuit for adjusting the precharge voltage on the switch such that the precharge voltage is increased if the delay time is greater than the desired delay time and reduced if the delay time is less than the desired delay time.

13. The circuit of claim 9, further wherein the circuit operates to turn off said switch, by providing said converted drive input signal such that, in time sequence, a turn off signal is provided that has a fourth slope, a fifth slope which is reduced with respect to said fourth slope and a sixth slope which is increased with respect to said fifth slope.

14. The circuit of claim 9, wherein said converted drive input signal reduces EMI.

15. The circuit of claim 9, wherein said converted drive input signal reduces switching losses.

16. The circuit of claim 10, wherein said switch is a MOSFET and the circuit for adjusting the precharge voltage comprises a circuit for adjusting the voltage on a gate capacitance of said switch.

* * * * *

UNITED STATES PATENT AND TRADEMARK OFFICE
CERTIFICATE OF CORRECTION

| | | |
|---|---|---|
| PATENT NO. | : 7,667,524 B2 | Page 1 of 1 |
| APPLICATION NO. | : 11/264970 | |
| DATED | : February 23, 2010 | |
| INVENTOR(S) | : Thiery et al. | |

It is certified that error appears in the above-identified patent and that said Letters Patent is hereby corrected as shown below:

On the Title Page, below Item (12) left column, line 2, "Thierry" should be changed to --Thiery--.

On the Title Page, Item (75) entitled Inventors, "Thierry" should be changed to --Thiery--.

Signed and Sealed this
First Day of November, 2011

David J. Kappos
*Director of the United States Patent and Trademark Office*